US009299281B2

(12) United States Patent
In (10) Patent No.: US 9,299,281 B2
(45) Date of Patent: Mar. 29, 2016

(54) DISPLAY DEVICE INCLUDING INSPECTION PAD HAVING A RESISTOR AND MANUFACTURING METHOD THEREOF

(71) Applicant: Samsung Display Co., Ltd., Yongin, Gyeonggi-do (KR)

(72) Inventor: Yun-Kyeong In, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/333,317

(22) Filed: Jul. 16, 2014

(65) Prior Publication Data

US 2015/0235913 A1    Aug. 20, 2015

(30) Foreign Application Priority Data

Feb. 20, 2014    (KR) .................. 10-2014-0019475

(51) Int. Cl.
| | |
|---|---|
| *H01L 21/20* | (2006.01) |
| *H01L 21/64* | (2006.01) |
| *H01L 21/71* | (2006.01) |
| *H01L 29/86* | (2006.01) |
| *G09G 3/00* | (2006.01) |
| *G02F 1/1345* | (2006.01) |

(52) U.S. Cl.
CPC ............ *G09G 3/006* (2013.01); *G02F 1/13458* (2013.01); *G09G 2330/04* (2013.01)

(58) Field of Classification Search
None
See application file for complete search history.

(56) References Cited

U.S. PATENT DOCUMENTS

| | | | | |
|---|---|---|---|---|
| 6,069,063 | A  * | 5/2000 | Chang et al. .................. | 438/528 |
| 6,180,479 | B1 * | 1/2001 | Yoshikawa .................... | 438/384 |
| 7,825,585 | B2 * | 11/2010 | Suh et al. ...................... | 313/504 |
| 2002/0125987 | A1 * | 9/2002 | Lee .......................... | H01L 28/20 |
| | | | | 338/309 |
| 2004/0203214 | A1 * | 10/2004 | Iizuka et al. .................. | 438/384 |
| 2009/0102364 | A1 | 4/2009 | Suh et al. | |
| 2011/0127519 | A1 | 6/2011 | Kang et al. | |
| 2013/0328131 | A1 * | 12/2013 | Lu et al. ........................ | 257/379 |

FOREIGN PATENT DOCUMENTS

| | | |
|---|---|---|
| KR | 10-2006-0000850 A | 1/2006 |
| KR | 10-2009-0040658 A | 4/2009 |
| KR | 10-2011-0059093 A | 6/2011 |
| KR | 10-2012-0121119 A | 11/2012 |

* cited by examiner

*Primary Examiner* — Joseph Schoenholtz
(74) *Attorney, Agent, or Firm* — Knobbe, Martens, Olson & Bear, LLP

(57) ABSTRACT

A display device and manufacturing method thereof are disclosed. In one aspect, the display device includes a substrate including a display area and a peripheral area surrounding the display area, wherein the display area includes a plurality of pixels configured to display images and a plurality of inspection pads formed in the peripheral area and configured to transmit a plurality of inspection signals to the pixels. Each of the inspection pads includes a poly resistor formed over the substrate, at least one insulating layer formed over the poly resistor, first and second conductive wires formed over the insulating layer and respectively connected to opposing ends of the poly resistor, and a protective layer formed over the insulating layer and substantially overlapping the poly resistor.

20 Claims, 7 Drawing Sheets

DISPLAY DEVICE INCLUDING INSPECTION PAD HAVING A RESISTOR AND MANUFACTURING METHOD THEREOF

INCORPORATION BY REFERENCE TO ANY PRIORITY APPLICATIONS

This application claims priority to and the benefit of Korean Patent Application No. 10-2014-0019475, filed on Feb. 20, 2014, with the Korean Intellectual Property Office, the disclosure of which is incorporated herein in its entirety by reference.

BACKGROUND

1. Field

The described technology generally relates to a display device including an inspection pad and a manufacturing method thereof.

2. Description of the Related Technology

Display devices include a display substrate including a plurality of pixels, each having an area defined by a black matrix or a pixel defining layer. Display devices can be categorized based on their display technology into liquid crystal displays (LCDs), plasma display panels (PDPs), organic light-emitting diode (OLED) display, etc.

Display substrates typically have a quadrilateral shape and include an active area configured to display images and a non-display area surrounding the active area. The active area includes a plurality of pixels arranged in a matrix and the pixels are driven by various signals and driving voltages which are provided from the non-display area via signal lines and power lines.

The standard display also includes a pad unit formed on one side of the non-display area so that a flexible printed circuit board such as flexible print circuit (FPC), chip on film (COF), or tape carrier package (TCP) can be mounted thereon.

The standard pad includes a driving pad unit and an inspection pad unit. The driving pad unit transmits the various signals and the driving voltages received from the flexible printed circuit board to the pixels. The inspection pad unit transmits various inspection signals to the pixels in order to inspect the pixels.

SUMMARY OF CERTAIN INVENTIVE ASPECTS

One inventive aspect is a display device including a protective layer for protecting a poly resistor of each inspection pad from damage caused by laser cutting and a manufacturing method thereof.

Another aspect is a display device including an active area including pixels configured to display an image and an inspection pad transmitting inspection signals to each pixel of the active area, wherein the inspection pad includes a substrate, a poly resistor on the substrate, an insulating layer on the poly resistor, a conductive layer connected to both end portions of the poly resistor through the insulating layer, and a protective layer on the insulating layer to overlap the poly resistor.

The protective layer may be insulated from the conductive layer.

The protective layer may be formed on the same layer as the conductive layer.

The insulating layer may be interposed between the protective layer and the conductive layer.

The protective layer may include at least one material selected from the group of metals, metal alloys, metal nitrides, conductive metal oxides, and transparent conductive materials.

The protective layer may include at least one element selected from the group of aluminum (Al), silver (Ag), tungsten (W), copper (Cu), nickel (Ni), chrome (Cr), molybdenum (Mo), titanium (Ti), platinum (Pt), tantalum (Ta) and alloys thereof, aluminum nitrides (AlNx), tungsten nitrides (WNx), chromium nitrides (CrNx), titanium nitrides (TiNx), tantalum nitrides (TaNx), zinc oxides (ZnOx), indium tin oxides (ITO), tin oxides (SnOx), indium oxides (InOx), gallium oxides (GaOX), and indium zinc oxides (IZO).

The protective layer may have a thickness of about 500 Å to about 5000 Å.

Another aspect is a method of manufacturing a display device including forming a poly resistor on a substrate, forming an insulating layer on the substrate on which the poly resistor is formed, forming contact holes in the insulating layer to expose both end portions of the poly resistor, and forming a conductive layer connected to the both end portions of the poly resistor and a protective layer overlapping the poly resistor on the insulating layer.

The forming of the conductive layer and the protective layer may further include: coating a conductive layer-forming material and patterning the conductive layer-forming material so as to form the conductive layer and the protective layer together.

Another aspect is a method of manufacturing a display device including forming a poly resistor on a substrate, forming a first insulating layer on the substrate on which the poly resistor is formed, forming a protective layer overlapping the poly resistor on the first insulating layer, forming a second insulating layer on the protective layer, forming contact holes on the first insulating layer and the second insulating layer to expose both end portions of the poly resistor, and forming a conductive layer connected to the both end portions of the poly resistor on the second insulating layer.

Another aspect is a display device, comprising a substrate including a display area and a peripheral area surrounding the display area, wherein the display area includes a plurality of pixels configured to display images; and a plurality of inspection pads formed in the peripheral area and configured to transmit a plurality of inspection signals to the pixels, wherein each of the inspection pads comprises: a poly resistor formed over the substrate; at least one insulating layer formed over the poly resistor; first and second conductive wires formed over the insulating layer and respectively connected to opposing ends of the poly resistor; and a protective layer formed over the insulating layer and substantially overlapping the poly resistor.

The protective layer can be electrically insulated from each of the first and second conductive wires. The protective layer can be formed on the same layer as the first and second conductive wires. A portion of the insulating layer can be interposed between i) the protective layer and ii) the first and second conductive wires. The protective layer can be formed of at least one of: metals, metal alloys, metal nitrides, conductive metal oxides, and transparent conductive materials. The protective layer can be formed of at least one of aluminum (Al), silver (Ag), tungsten (W), copper (Cu), nickel (Ni), chrome (Cr), molybdenum (Mo), titanium (Ti), platinum (Pt), tantalum (Ta) and alloys thereof, aluminum nitrides (AlNx), tungsten nitrides (WNx), chromium nitrides (CrNx), titanium nitrides (TiNx), tantalum nitrides (TaNx), zinc oxides (ZnOx), indium tin oxides (ITO), tin oxides (SnOx), indium oxides (InOx), gallium oxides (GaOX), and indium zinc oxides (IZO). The protective layer can have a thickness of about 500 Å to about 5000 Å. The at least one insulating layer can include first and second insulating layers and wherein the protective layer is interposed between the first and second insulating layers. A plurality of contact holes can be formed in the insulating layer and wherein the first and second conductive wires are connected to the poly resistor via the contact holes.

Another aspect is a method of manufacturing a display device, the method comprising forming a poly resistor over a substrate; forming an insulating layer over the poly resistor; forming a plurality of contact holes in the insulating layer to expose opposing ends of the poly resistor; forming first and second conductive wires over the insulating layer, wherein the first and second conductive wires are respectively connected to the opposing ends of the poly resistor via the contact holes; and forming a protective layer over the insulating layer, wherein the protective layer at least partially overlaps the poly resistor.

The forming of the first and second conductive wires and the protective layer can comprise coating a conductive layer-forming material over the insulating layer; and patterning the conductive layer-forming material so at to form the first and second conductive wires and the protective layer.

Another aspect is a method of manufacturing a display device, the method comprising forming a poly resistor over a substrate; forming a first insulating layer over the poly resistor; forming a protective layer over the first insulating layer, wherein the protective layer at least partially overlaps the poly resistor; forming a second insulating layer over the protective layer; forming a plurality of contact holes in the first and second insulating layers so as to expose opposing ends of the poly resistor; and forming first and second conductive wires over the second insulating layer, wherein the first and second wires are respectively connected to the opposing ends of the poly resistor via the contact holes.

Another aspect is a display device, comprising a substrate; a plurality of pixels formed over the substrate; a plurality of inspection pads formed over the substrate and configured to apply a plurality of inspection signals to the pixels, wherein each of the inspection pads includes: a resistor formed over the substrate; first and second conductive wires formed over the poly resistor and respectively connected to opposing ends of the poly resistor; and a protective layer formed over and substantially overlapping the poly resistor.

The protective layer can be electrically insulated from at least one of the first and second conductive wires. The protective layer can be formed on the same layer as the first and second conductive wires. The display device can further comprise a first insulating layer interposed between the resistor and the protective layer; and a second insulating layer interposed between i) the protective layer and ii) the first and second conductive wires. The width of the resistor can be greater than that of the protective layer. The display device can further comprise an insulating layer interposed between i) the protective layer and ii) the first and second conductive wires. The resistor can be a poly resistor and wherein a plurality of contact holes are formed in the insulating layer and the first and second conductive wires can be connected to the poly resistor via the contact holes. The protective layer can have a thickness of about 500 Å to about 5000 Å.

According to at least one embodiment, the display device and the manufacturing method thereof can protect the poly resistor of the inspection pad such that damage due to laser cutting on the poly resistor can be prevented.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

In general, inspection pad units are formed on both sides of the driving pad unit. Each inspection pad of the inspection pad unit includes an electrostatic discharge (ESD) protection element in order to prevent ESD damage. ESD is a sudden surge of current triggered when the separated objects having a large voltage difference therebetween are brought into contact. In order to prevent ESD damage, semiconductor materials such as a poly resistor formed of a polysilicon layer can be included as an ESD protection element in the inspection pad unit.

One recent development in display manufacturing includes cutting a lower corner area of the display substrate by a laser or the like in order to mount a module therein and improve the rigidity of the device. Inspection pads which are formed relatively close to the laser cutting line can be damaged and the poly resistor of the inspection pad may be disconnected. Such damage can be prevented by providing a buffer region between the cutting line and inspection pads. However, this may not allow for a large enough area in the corner to be cut for certain applications.

Hereinafter, embodiments of the described technology will be described in more detail with reference to the accompanying drawings.

Although the described technology can be modified in various ways and have several embodiments, specific embodiments are illustrated in the accompanying drawings and will be mainly described in the specification. However, the scope of the described technology is not limited to the specific embodiments and should be construed as including all the changes, equivalents, and substitutions included in the spirit and scope of the described technology.

Throughout the specification, when an element is referred to as being "connected" to another element, the element can be "directly connected" to the other element, or "connected" to the other element with one or more intervening elements interposed therebetween. It will be further understood that the terms "comprises," "comprising," "includes" and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Some portions of the described technology which are not associated with the description may be omitted from the description for the sake of clarity in order to specifically describe the embodiments. Like reference numerals refer to like elements throughout the specification.

Figure 1:
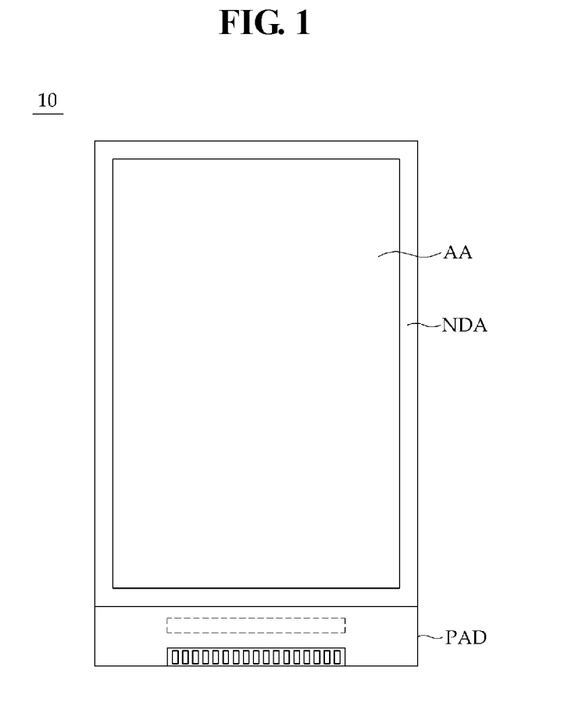
FIG. 1 is a schematic plan view showing a standard display substrate.

FIG. 1 is a schematic plan view showing a standard display substrate.

The standard display substrate 10 has a quadrilateral shape and includes an active area or display area AA for displaying images and a non-display area or peripheral area NDA surrounding the active area AA.

The active area AA includes a plurality of pixels arranged in a matrix and the pixels are driven by driving signals and driving voltages that are transmitted over various signal lines and power lines from the non-display area NDA.

In addition, a pad unit PAD is further formed on one side of the non-display area NDA such that a flexible printed circuit board or the like which supplies the driving signals and the driving voltages to the active area AA can be mounted thereon. The flexible printed circuit board can include a flexible print circuit (FPC), a chip on film (COF), a tape carrier package (TCP), or the like.

Figure 2:
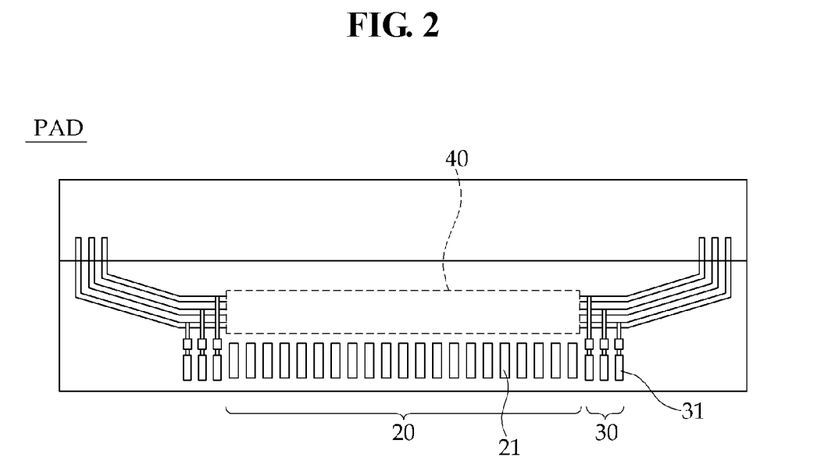
FIG. 2 is an enlarged plan view showing the pad unit of the standard display substrate.

FIG. 2 is an enlarged plan view showing the pad unit of the standard display substrate.

Referring to FIGS. 1 and 2, the pad unit PAD is formed on one side of the non-display unit NDA and includes a driving pad unit 20 and an inspection pad unit 30. Further, a boxed area enclosed by the dotted lines 40 in FIGS. 1 and 2 represents the area in which a driver integrated circuit IC is mounted.

The driving pad unit 20 includes a plurality of driving pads 21 arranged in one direction. The driving pads 21 transmit the driving signals and the driving voltages applied by the flexible printed circuit board to each pixel of the active area AA during the actual driving of the display. "Actual driving" refers to the period when each pixel of the active area AA emits light in response to the driving signals and the driving voltages applied thereto from the flexible printed circuit board which has been mounted on the display substrate 10.

FIGS. 1 and 2 illustrate the display substrate 10 when the flexible printed circuit board is not mounted thereon so that neither the driving signal nor the driving voltage is applied to the driving pads 21.

The inspection pad unit 30 includes a plurality of inspection pads 31 arranged on both sides of the driving pad unit 20. The inspection pads 31 transmit various inspection signals to each pixel of the active area AA in order to inspect each pixel of the active area AA before the flexible printed circuit board is mounted on the display substrate 10. FIG. 2 illustrates an embodiment where three inspection pads 31 are formed on each side of the driving pad unit 20, however, the described technology is not limited thereto. Thus the number of inspection pads 31 may vary. Further, the position, size, and arrangement of the inspection pad units 30 and the driving pad units 20 are not limited to the embodiment depicted in FIG. 2 and can be modified when necessary.

Further, each inspection pad 31 includes an electrostatic discharge (ESD) protection element to avoid ESD damage. In order to prevent ESD damage, the inspection pad units 31 may include semiconductor materials such as a poly resistor formed of a poly silicon layer as an ESD protection element. A poly resistor is a resistor formed by doping polysilicon with P-type or N-type dopants.

Figure 3A:
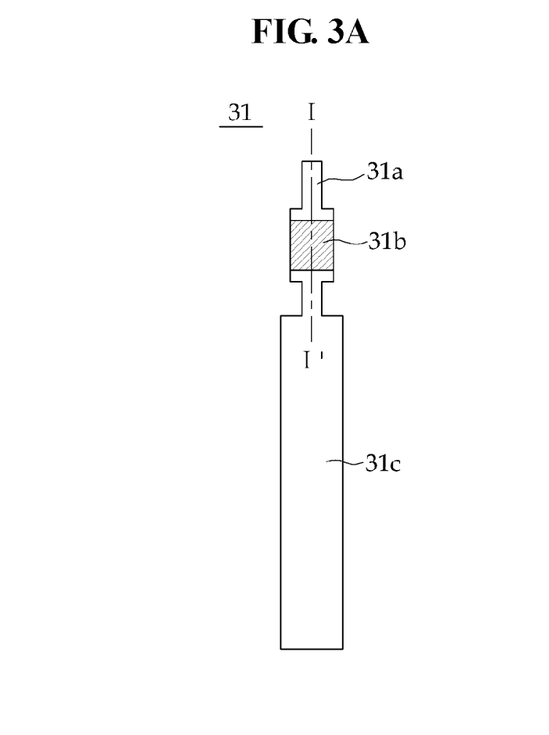
FIG. 3A is a plan view showing an inspection pad of the standard display substrate.
Figure 3B:
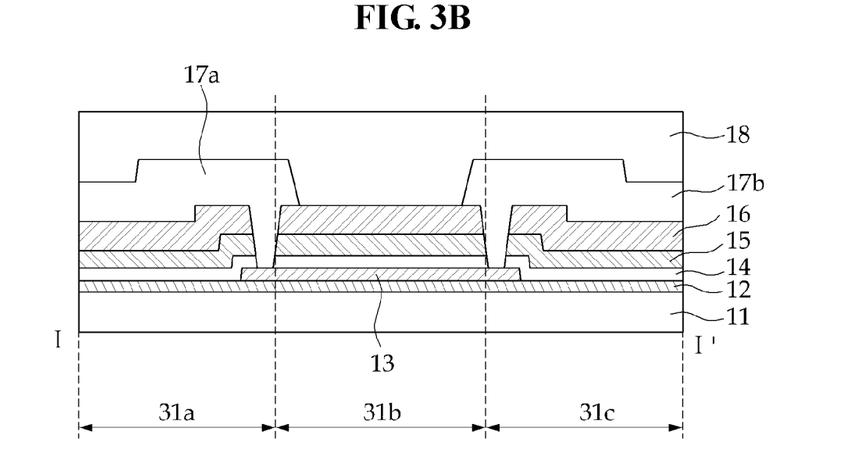
FIG. 3B is a cross-sectional view taken along line I-I' of FIG. 3A.

FIG. 3A is a plan view showing the inspection pad of the standard display substrate and FIG. 3B is a cross-sectional view taken along line I-I' of FIG. 3A.

Referring to FIG. 3A, the inspection pad 31 includes a signal input section 31a for inputting the inspection signals to the signal line connected to each pixel, a signal transmission section 31c for mounting the flexible printed circuit board or the like thereon, and a resistor section 31b for protecting the pixels from ESD damage. The resistor section 31b is located between the signal input section 31a and the signal transmission section 31c.

Referring to FIG. 3B, the inspection pad 31 includes a substrate 11, a buffer layer 12 formed on the substrate 11, and a poly resistor 13 formed on the buffer layer 12 in the resistor section 31b. A first insulating layer 14 is formed on the buffer layer 12 and the poly resistor 13, a second insulating layer 15 is formed on the first insulating layer 14, and a third insulating layer 16 is formed on the second insulating layer 15. Conductive layers or conductive wires 17a and 17b are connected to the poly resistor 13 through the first insulating layer 14, the second insulating layer 15, and the third insulating layer 16, and an organic layer 18 is formed on the conductive layers 17a and 17b.

Thus, the inspection signals are transmitted to each pixel via the conductive layer 17b formed in the signal transmission section 31c and the conductive layer 17a formed in the signal input section 31a.

Figure 4:
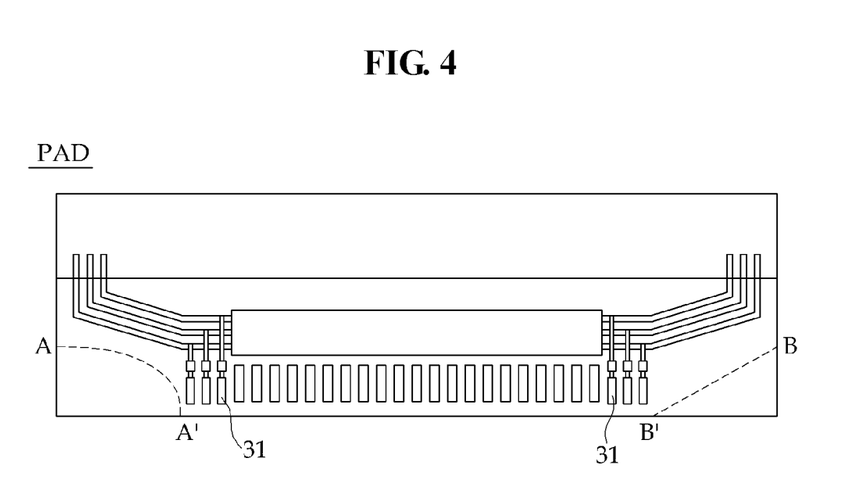
FIG. 4 is a plan view illustrating a laser cutting line on the display substrate.

It may be advantageous, as illustrated in FIG. 4, to cut a lower corner area of the display substrate 10 (namely, a lower corner area of the pad unit (PAD)) by a laser or the like in order to mount a module therein to improve the rigidity of the display device.

In these embodiments, an inspection pad 31 formed relatively close to a laser cutting line (A-A' or B-B', for example) may be damaged by the laser. Referring again to FIG. 3, since the poly resistor 13 in the resistor section 31b has only the insulating layers 14, 15, and 16 and the organic layer 18 formed thereon, the poly resistor 13 is vulnerable to external shock. Therefore, the poly resistor 13 of the inspection pad 31 may be damaged, and thus, disconnect the first and second conductive layer 17a and 17b from each other during the laser cutting process.

In order to prevent damage to the poly resistor, a laser cutting process may be performed at a predetermined distance from the inspection pad unit. However, due to the required spacing from the inspection pad unit, the display substrate may not be cut with sufficient dimensions to satisfy desired requirements.

Therefore, the display device according to an embodiment further includes a protective layer or a capping layer in order to protect the poly resistor of the inspection pad from being damaged in the laser cutting process of the display substrate.

Figure 5A:
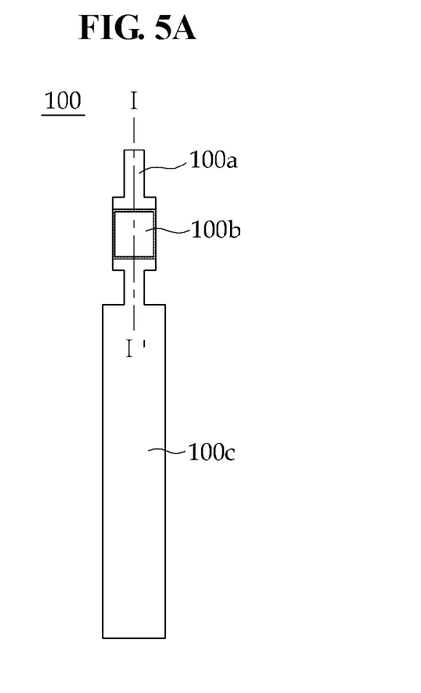
FIG. 5A is a plan view showing an inspection pad according to an embodiment.
Figure 5B:
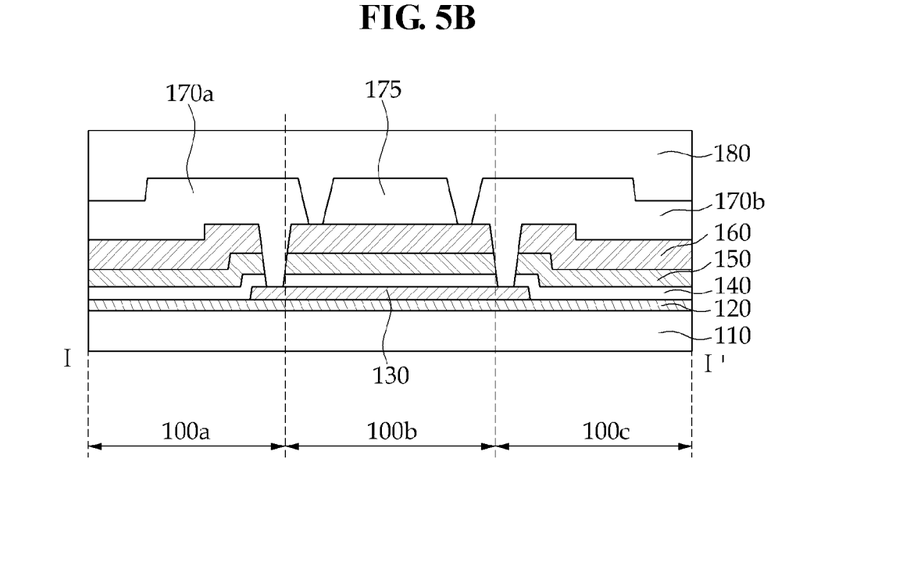
FIG. 5B is a cross-sectional view taken along line I-I' of FIG. 5A.

FIG. 5A is a plan view showing an inspection pad according to an embodiment. FIG. 5B is a cross-sectional view taken along line I-I' of FIG. 5A.

Referring to FIG. 5A, the inspection pad 100 includes a signal input section 100a for inputting inspection signals to a signal line connected to each pixel, a signal transmission section 100c for mounting a flexible printed circuit board or the like thereon, and a resistor section 100b for protecting the pixels from ESD damage. The resistor section 100b is located between the signal input section 100a and the signal transmission section 100c.

Referring to FIG. 5B, the inspection pad 100 includes a substrate 110, a buffer layer 120 formed on the substrate 110, and a poly resistor 130 formed on the buffer layer 120 in the resistor section 100b. The inspection pad 100 further includes a first insulating layer 140 formed on the buffer layer 120 and the poly resistor 130, a second insulating layer 150 formed on the first insulating layer 140, and a third insulating layer 160 formed on the second insulating layer 150. Conductive layers 170a and 170b are connected to the poly resistor 130 through the first insulating layer 140, the second insulating layer 150, and the third insulating layer 160. A protective layer 175 is formed between the conductive layers 170a and 170b and an organic layer 180 is formed on the protective layer 175.

Thus, the inspection signals are transmitted to each pixel via the conductive layer 170b formed in the signal transmission section 100c and the conductive layer 170a formed in the signal input section 100a.

The substrate 110 may be formed of glass, quartz, ceramic, plastic, or the like. Plastic may be at least one element selected from the group of polyimide resins, acrylic resins, polyacrylate resins, polycarbonate resins, polyether resins, polyethylene terephthalate resins, and sulfonic acid resins. Further, the substrate 110 may be a metal substrate formed of stainless steel or the like.

The buffer layer 120 may be formed of silicon compounds and may have a monolayer or multilayer structure. The buffer layer 120 plays a role in preventing impurities or moisture from infiltrating and in planarizing the upper surface of the substrate 110. However, the buffer layer 120 is not always necessary and may be omitted depending on the type of the substrate 110 and process conditions thereof.

The poly resistor 130 is formed on the buffer layer 120 in the resistor section 100b. The poly resistor 130 can prevent ESD damage to the pixels when the inspection signals are applied.

In some embodiments, the poly resistor 130 is a resistor element formed by doping poly silicon by ion implantation. That is, the poly resistor 130 may be formed by coating poly silicon on the substrate 110, patterning the poly silicon to form a poly silicon pattern in the resistor sections 110b, and then ion doping the poly silicon pattern. The poly resistor 130 may have a thickness of about 470 Å.

The poly resistor is provided as an example of the electrostatic discharge protection element, however, the described technology is not limited thereto, and thus other materials such as an oxide semiconductor or amorphous silicon may be used as the electrostatic discharge protection element.

The first insulating layer 140, the second insulating layer 150, and the third insulating layer 160 may include a silicon nitride layer (SiNx), a silicon oxide layer (SiOx), a hafnium oxide layer (HfOx), an aluminum oxide layer (AlOx), a yttrium oxide layer (YOx), or a tantalum oxide layer (TaOx). These materials can be used solely or in combination with one another.

The conductive layers 170a and 170b and the protective layer 175 may be formed of metals, metal alloys, metal nitrides, conductive metal oxides, transparent conductive materials or a combination thereof. For example, the conductive layers 170a and 170b and the protective layer 175 may include at least one element selected from the group of aluminum (Al), silver (Ag), tungsten (W), copper (Cu), nickel (Ni), chrome (Cr), molybdenum (Mo), titanium (Ti), platinum (Pt), tantalum (Ta) and alloys thereof, aluminum nitrides (AlNx), tungsten nitrides (WNx), chromium nitrides (CrNx), titanium nitrides (TiNx), tantalum nitrides (TaNx), zinc oxides (ZnOx), indium tin oxides (ITO), tin oxides (SnOx), indium oxides (InOx), gallium oxides (GaOX), and indium zinc oxides (IZO).

The conductive layers 170a and 170b may be connected to the poly resistor 130 through the first insulating layer 140, the second insulating layer 150, and the third insulating layer 160 respectively.

The conductive layers 170a and 170b and the protective layer 175 may be formed of the same material. That is, the conductive layers 170a and 170b and the protective layer 175 may be formed by coating a conductive layer-forming material on the third insulating layer 160 and then patterning the conductive layer-forming material.

The protective layer 175 is formed on the third insulating layer 160 in the resistor section 100b, and may have a thickness of about 5000 Å. In other words, the protective layer 175 is formed on the poly resistor 130 to aid in protecting the poly resistor 130 from damage in the laser cutting process.

The protective layer 175 may be spaced apart from the conductive layers 170a and 170b, so that the conductive layers 170a and 170b can transmit the inspection signals via the poly resistor 130. Further, in some embodiments, the protective layer 175 is connected to only one of the conductive layers 170a and 170b.

The organic layer 180 is formed on the conductive layers 170a and 170b and the protective layer 175 for insulation and planarization. Acrylic or polyimide may be used for the organic layer 180.

Figure 6A:
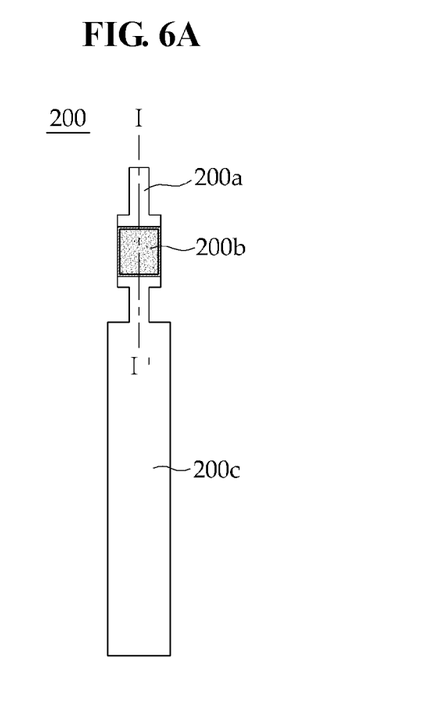
FIG. 6A is a plan view showing an inspection pad according to another embodiment.
Figure 6B:
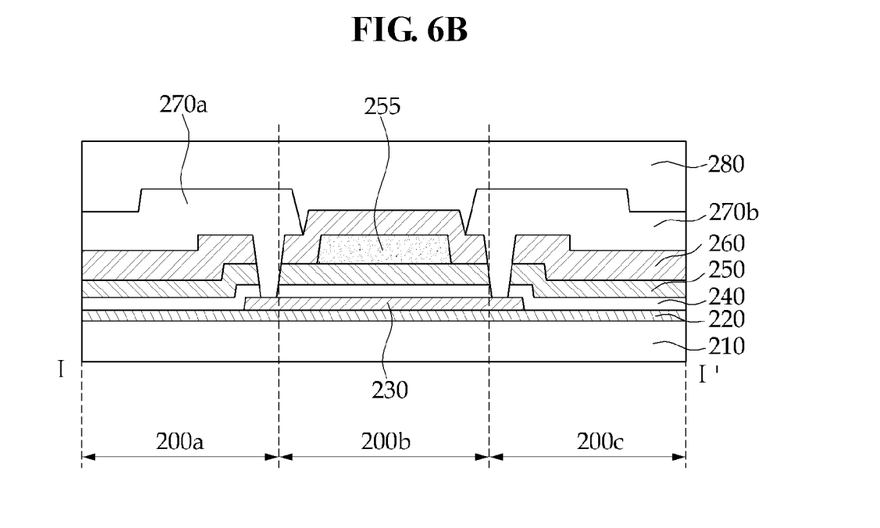
FIG. 6B is a cross-sectional view taken along line I-I' of FIG. 6A.

FIG. 6A is a plan view showing an inspection pad according to another embodiment. FIG. 6B is a cross-sectional view taken along line I-I' of FIG. 6A. Repeated descriptions will not be provided for elements the same as or similar to those of the previous embodiment.

Referring to FIG. 6A, inspection pad 200 includes a signal input section 200a for inputting inspection signals to a signal line connected to each pixel, a signal transmission section 200c for mounting a flexible printed circuit board or the like thereon, and a resistor section 200b for protecting the pixels from ESD damage. The resistor section 200b is located between the signal input section 200a and the signal transmission section 200c.

Referring to FIG. 6B, the inspection pad 200 includes a substrate 210, a buffer layer 220 formed on the substrate 210, and a poly resistor 230 formed on the buffer layer 220 in the resistor section 200b. The inspection pad 200 also includes a first insulating layer 240 formed on the buffer layer 220 and the poly resistor 230, a second insulating layer 250 formed on the first insulating layer 240, a protective layer 255 formed on the second insulating layer 250 in the resistor section 200b, and a third insulating layer 260 formed on the second insulating layer 250 and the protective layer 255. The inspection pad 200 further includes conductive layers 270a and 270b connected to the poly resistor 230 through the first to third insulating layers 240, 250 and 260 and an organic layer 280 formed on the conductive layers 270a and 270b.

Thus, the inspection signals are transmitted to each pixel via the conductive layer 270b in the signal transmission section 200c and the conductive layer 270a in the signal input section 200a.

The protective layer 255 may be formed of metals, metal alloys, metal nitrides, conductive metal oxides, transparent conductive materials, or the like. For example, the protective layer 255 may be formed of at least one element selected from the group of aluminum (Al), silver (Ag), tungsten (W), copper (Cu), nickel (Ni), chrome (Cr), molybdenum (Mo), titanium (Ti), platinum (Pt), tantalum (Ta) and alloys thereof, aluminum nitrides (AlNx), tungsten nitrides (WNx), chromium nitrides (CrNx), titanium nitrides (TiNx), tantalum nitrides (TaNx), zinc oxides (ZnOx), indium tin oxides (ITO), tin oxides (SnOx), indium oxides (InOx), gallium oxides (GaOX), and indium zinc oxides (IZO).

The protective layer 255 is formed on the second insulating layer 250 in the resistor section 200b, and may have a thickness of about 2500 Å. In other words, the protective layer 255 is formed on the poly resistor 230 to aid in protecting the poly resistor 230 from the damage by the laser.

FIGS. 7A to 7E are cross-sectional views illustrating a method of manufacturing an inspection pad according to an embodiment.

Figure 7A:
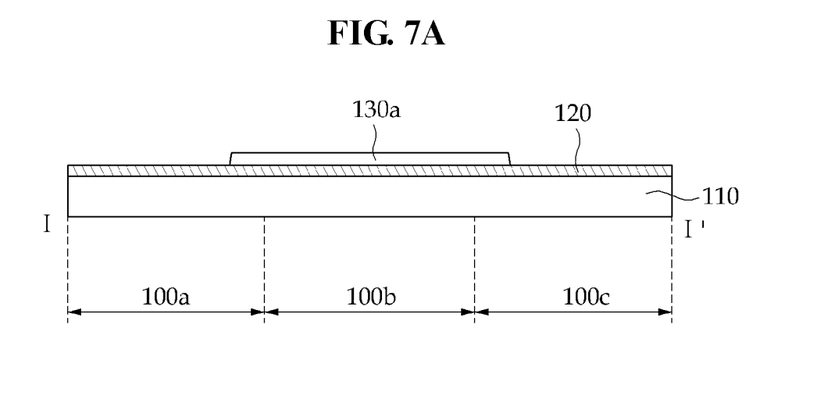
FIGS. 7A to 7E are cross-sectional views illustrating a method of manufacturing a display device according to an embodiment.

Referring to FIG. 7A, a buffer layer 120 and a semiconductor layer (not illustrated) are formed on a substrate 110. The substrate may be formed of an insulating material such as glass or plastic. The buffer layer 120 and the semiconductor layer (not illustrated) may be formed by sequentially coating a buffer layer-forming material and a semiconductor layer-forming material and patterning the semiconductor layer-forming material the semiconductor layer so as to form a semiconductor layer pattern 130a in a resistor section 100b. The semiconductor layer-forming material may be a silicon-based semiconductor material such as amorphous silicon or polycrystalline silicon or an oxide semiconductor material. The following description will describe an embodiment where polycrystalline silicon is used as the semiconductor layer-forming material. The buffer layer 120 and the semiconductor layer (not illustrated) may be formed by at least one of a chemical vapor deposition process, a plasma enhanced chemical vapor deposition process, a low pressure chemical vapor deposition process, and a sputtering process. Further, the semiconductor layer may be patterned to form the semiconductor layer pattern 130a by a photolithography process using a first mask.

Figure 7B:
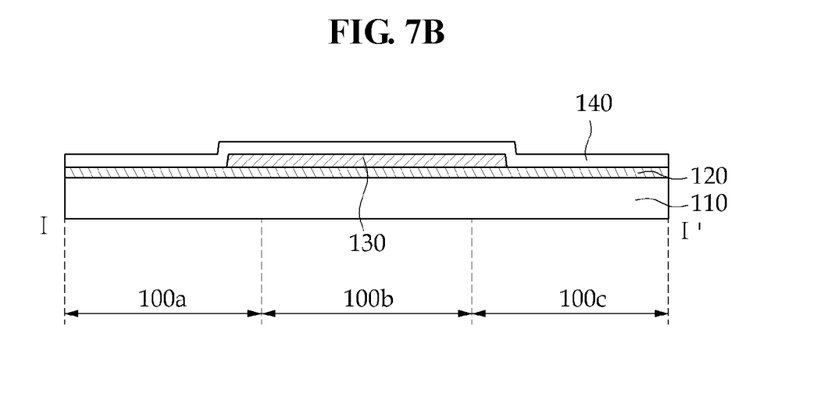

Referring to FIG. 7B, a first insulating layer 140 is coated on the substrate 110 over the semiconductor layer pattern 130a. A crystallization process may be further performed such that a poly resistor 130 can be formed from the semiconductor layer pattern 130a. The crystallization process may include at least one of a laser irradiation process, a heat treatment process, and a heat treatment process using a catalyst.

Thus, according to at least one embodiment, the poly resistor 130 is a resistor material formed by doping the semiconductor layer pattern 130a by ion implantation. In some embodiments, the poly resistor 130 has a thickness of about 470 Å.

Figure 7C:
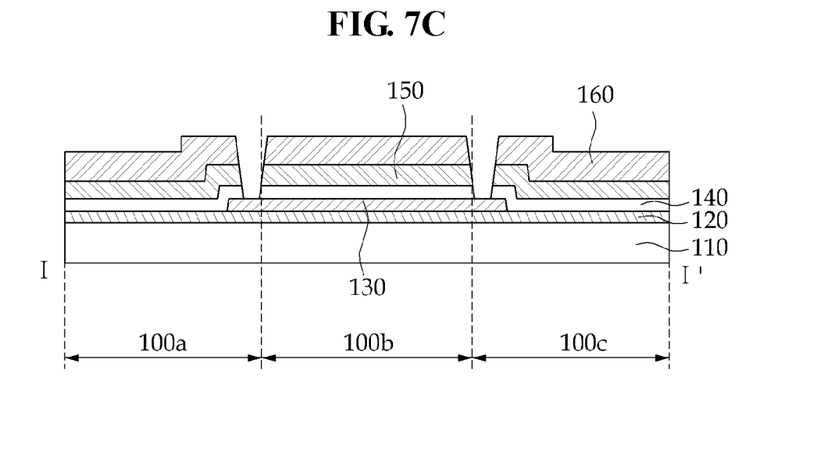

Referring to FIG. 7C, a second insulating layer 150 and a third insulating layer 170 are sequentially coated on the buffer layer 120 and the poly resistor 130, and then contact holes are formed to expose both end portions of the poly resistor 130.

The first insulating layer 140, the second insulating layer 150, and the third insulating layer 160 may be formed by a chemical vapor deposition process, a spin coating process, a plasma enhanced chemical vapor deposition process, a sputtering process, a vacuum deposition process, a high-density plasma-chemical vapor deposition process, a printing process, or the like.

According to an embodiment, the three insulating layers 140, 150, and 160 are formed on the poly resistor 130, however, the described technology is not limited thereto. The number of insulating layers may vary depending on the design requirements of the display device.

Figure 7D:
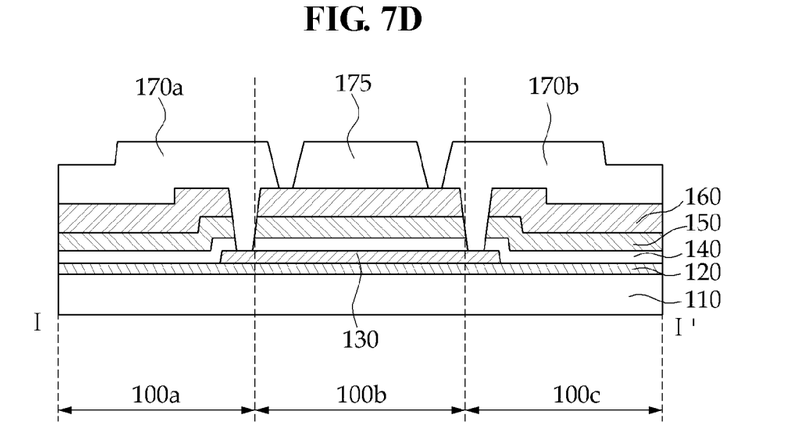

Referring to FIG. 7D, a conductive layer-forming material (not illustrated) filling the contact holes exposing the both end portions of the poly resistor 130 is coated on the third insulating layer 160. Next, insulating layers 170a and 170b and a protective layer 175 are formed by patterning the conductive layer-forming material.

The conductive layer-forming material may be formed by a sputtering process, a chemical vapor deposition process, a pulse laser deposition process, a vacuum deposition process, an atomic deposition process, or the like. Further, the conductive layers 170a and 170b and the protective layer 175 may be patterned by a photolithography process using a second mask.

Each of the conductive layers 170a and 170b is connected to each end portion of the poly resistor 130 through the contact holes. Further, in some embodiments, each of the conductive layers 170a and 170b and the protective layer 175 are respectively are spaced apart from one another.

The conductive layers 170a and 170b and the protective layer 175 may have a thickness of about 1000 Å to about 5000 Å.

Figure 7E:
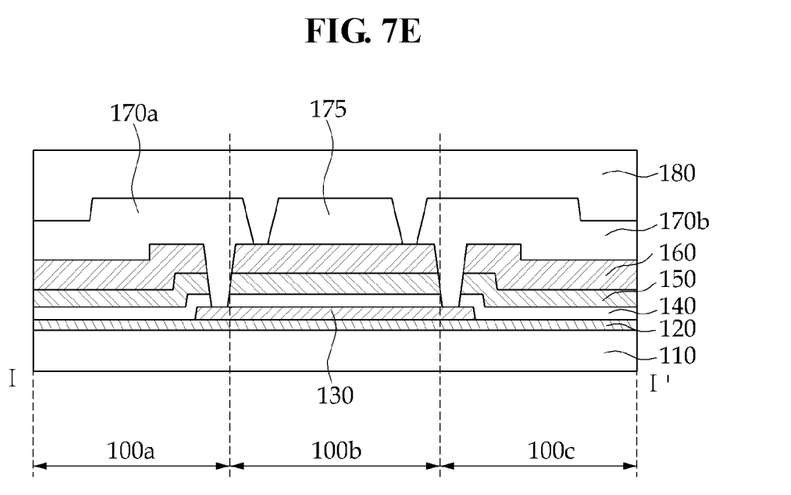

Referring to FIG. 7E, an organic layer 180 is formed on the conductive layers 170a and 170b and the protective layer 175 for insulation and planarization. The organic layer 180 may be formed of acrylic and/or polyimide.

From the foregoing, it will be appreciated that various embodiments of the inventive technology have been described herein for the purpose of illustration and that various modifications may be made without departing from the scope and spirit of the invention. Accordingly, the various embodiments disclosed herein are not intended to be limiting, with the true scope and spirit being indicated by the following claims, and equivalents thereof.

What is claimed is:

1. A display device, comprising:
   a substrate including a display area and a peripheral area surrounding the display area, wherein the display area includes a plurality of pixels configured to display images; and
   a plurality of inspection pads disposed in the peripheral area and configured to transmit a plurality of inspection signals to the pixels,
   wherein each of the inspection pads comprises:
      a poly resistor disposed over the substrate;
      at least one insulating layer disposed over the poly resistor;
      first and second conductive wires disposed over the insulating layer and respectively connected to the poly resistor; and
      a protective layer disposed over the insulating layer and substantially overlapping the poly resistor,
      wherein the protective layer is spaced apart from the first and second conductive wires.

2. The display device of claim 1, wherein the protective layer is electrically insulated from each of the first and second conductive wires.

3. The display device of claim 1, wherein the protective layer is disposed on the same layer as the first and second conductive wires.

4. The display device of claim 1, wherein a portion of the insulating layer is interposed between i) the protective layer and ii) the first and second conductive wires.

5. The display device of claim 1, wherein the protective layer comprises at least one of: metals, metal alloys, metal nitrides, conductive metal oxides, and transparent conductive materials.

6. The display device of claim 5, wherein the protective layer comprises at least one of aluminum (Al), silver (Ag), tungsten (W), copper (Cu), nickel (Ni), chrome (Cr), molybdenum (Mo), titanium (Ti), platinum (Pt), tantalum (Ta) and alloys thereof, aluminum nitrides (AlNx), tungsten nitrides (WNx), chromium nitrides (CrNx), titanium nitrides (TiNx), tantalum nitrides (TaNx), zinc oxides (ZnOx), indium tin oxides (ITO), tin oxides (SnOx), indium oxides (InOx), gallium oxides (GaOX), and indium zinc oxides (IZO).

7. The display device of claim 1, wherein the protective layer has a thickness of about 500 Å to about 5000 Å.

8. The display device of claim 1, wherein the at least one insulating layer includes first and second insulating layers and wherein the protective layer is interposed between the first and second insulating layers.

9. The display device of claim 1, wherein a plurality of contact holes are formed in the insulating layer and wherein the first and second conductive wires are connected to the poly resistor via the contact holes.

10. A method of manufacturing a display device, the method comprising:
    forming a poly resistor over a substrate;
    forming an insulating layer over the poly resistor;
    forming a plurality of contact holes in the insulating layer to expose the poly resistor;
    forming first and second conductive wires over the insulating layer, wherein the first and second conductive wires are respectively connected to the poly resistor via the contact holes; and
    forming a protective layer over the insulating layer,
    wherein the protective layer at least partially overlaps the poly resistor, and
    wherein the protective layer is spaced apart from the first and second conductive wires.

11. The method of claim 10, wherein the forming of the first and second conductive wires and the protective layer comprises:
    coating a conductive layer-forming material over the insulating layer; and
    patterning the conductive layer-forming material so at to form the first and second conductive wires and the protective layer.

12. A method of manufacturing a display device, the method comprising:
    forming a poly resistor over a substrate;
    forming a first insulating layer over the poly resistor;
    forming a protective layer over the first insulating layer, wherein the protective layer at least partially overlaps the poly resistor;
    forming a second insulating layer over the protective layer;
    forming a plurality of contact holes in the first and second insulating layers so as to expose the poly resistor; and
    forming first and second conductive wires over the second insulating layer,
    wherein the first and second conductive wires are respectively connected to the poly resistor via the contact holes, and
    wherein the protective layer is spaced apart from the first and second conductive wires.

13. A display device, comprising:
    a substrate;
    a plurality of pixels disposed over the substrate;
    a plurality of inspection pads disposed over the substrate and configured to apply a plurality of inspection signals to the pixels, wherein each of the inspection pads includes:
    a resistor disposed over the substrate;
    first and second conductive wires disposed over the resistor and respectively connected to the resistor; and
    a protective layer disposed over and substantially overlapping the resistor,
    wherein the protective layer is spaced apart from the first and second conductive wires.

14. The display device of claim 13, wherein the protective layer is electrically insulated from at least one of the first and second conductive wires.

15. The display device of claim 13, wherein the protective layer is disposed on the same layer as the first and second conductive wires.

16. The display device of claim 13, further comprising:
    a first insulating layer interposed between the resistor and the protective layer; and
    a second insulating layer interposed between i) the protective layer and ii) the first and second conductive wires.

17. The display device of claim 13, wherein the width of the resistor is greater than that of the protective layer.

18. The display device of claim 13, further comprising an insulating layer interposed between i) the protective layer and ii) the first and second conductive wires.

19. The display device of claim 13, wherein the resistor is a poly resistor and wherein a plurality of contact holes are formed in the insulating layer and wherein the first and second conductive wires are connected to the poly resistor via the contact holes.

20. The display device of claim 13, wherein the protective layer has a thickness of about 500 Å to about 5000 Å.

* * * * *